(12) United States Patent
Lv

(10) Patent No.: US 10,665,622 B2
(45) Date of Patent: May 26, 2020

(54) MANUFACTURING METHOD OF ARRAY SUBSTRATE AND ARRAY SUBSTRATE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Xiaowen Lv, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 65 days.

(21) Appl. No.: 16/203,785

(22) Filed: Nov. 29, 2018

(65) Prior Publication Data
US 2020/0027906 A1    Jan. 23, 2020

Related U.S. Application Data

(63) Continuation of application No. PCT/CN2018/104467, filed on Sep. 7, 2018.

(30) Foreign Application Priority Data

Jul. 17, 2018   (CN) .......................... 2018 1 0784374

(51) Int. Cl.
*H01L 27/12*   (2006.01)
*H01L 29/04*   (2006.01)

(52) U.S. Cl.
CPC ...... *H01L 27/1288* (2013.01); *H01L 27/1218* (2013.01); *H01L 27/1262* (2013.01)

(58) Field of Classification Search
CPC ............. H01L 27/1288; H01L 27/1218; H01L 27/1262

(Continued)

(56) References Cited

U.S. PATENT DOCUMENTS

2008/0012022 A1* 1/2008 Moriwaki ............. H01L 29/458
257/72
2009/0147168 A1* 6/2009 Lu ......................... H01L 27/124
349/43

(Continued)

FOREIGN PATENT DOCUMENTS

CN    104377167 A    2/2015
CN    107623009 A    1/2018

*Primary Examiner* — Sheikh Maruf
(74) *Attorney, Agent, or Firm* — Leong C. Lei

(57) ABSTRACT

Disclosed is a manufacturing method of an array substrate, comprising steps of: depositing a first metal layer on a substrate; depositing a gate insulating layer on the substrate and the first metal layer, and forming a first via hole in the in-plane region of the gate insulating layer; depositing a second metal layer in an in-plane region and an out-of-plane of the gate insulating layer, wherein the second metal layer located in the in-plane region fills the first via hole; depositing a passivation layer on the second metal layer and the gate insulating layer, and forming a second via hole in the in-plane region of the passivation layer; forming a third via hole and a fourth via hole in the out-of plane region of the passivation layer, respectively; depositing a transparent conductive layer in the in-plane region and in the out-of-plane region of the passivation layer, respectively.

10 Claims, 4 Drawing Sheets

(58) Field of Classification Search
USPC ..... 257/72; 438/48, 128, 149, 151, 157, 283
See application file for complete search history.

(56) References Cited

U.S. PATENT DOCUMENTS

| | | | |
|---|---|---|---|
| 2015/0214247 A1* | 7/2015 | Qin | G02F 1/1362 |
| | | | 257/72 |
| 2016/0013210 A1* | 1/2016 | Li | H01L 27/124 |
| | | | 257/72 |
| 2016/0027801 A1* | 1/2016 | Jiang | H01L 21/77 |
| | | | 257/43 |
| 2016/0155755 A1* | 6/2016 | Liu | H01L 27/124 |
| | | | 257/72 |
| 2016/0181289 A1* | 6/2016 | Long | H01L 27/1214 |
| | | | 257/71 |
| 2017/0033233 A1* | 2/2017 | Yamazaki | H01L 29/7869 |
| 2017/0271370 A1* | 9/2017 | Wang | G02F 1/133345 |
| 2018/0182779 A1* | 6/2018 | Song | H01L 29/417 |
| 2018/0211978 A1* | 7/2018 | Guo | H01L 27/1222 |
| 2018/0331228 A1* | 11/2018 | Oikawa | H04L 29/45 |
| 2019/0103419 A1* | 4/2019 | Wang | H01L 29/78633 |

\* cited by examiner

MANUFACTURING METHOD OF ARRAY SUBSTRATE AND ARRAY SUBSTRATE

CROSS-REFERENCE TO RELATED APPLICATION

This application is a continuing application of PCT Patent Application No. PCT/CN2018/104467 entitled "Manufacturing method of array substrate and array substrate", filed on Sep. 7, 2018, which claims priority to Chinese Patent Application No. 201810784374.5, filed on Jul. 17, 2018, both of which are hereby incorporated in its entireties by reference.

FIELD OF THE INVENTION

The present invention relates to a display field, and more particularly to a manufacturing method of an array substrate and an array substrate.

BACKGROUND OF THE INVENTION

In an array substrate of a thin film transistor liquid crystal display (TFT-LCD), for the active layer in the TFT, an IGZO (indium gallium zinc oxide) material having a high mobility is widely used, and meanwhile, a splicing screen is also increasingly and widely used in our daily lives. The gate insulating layer material of the IGZO active layer is generally made of SiOx or SiOx/SiNx composite material, and an etching rate of SiOx is lower and an etching time is longer in comparison with SiNx. As shown in FIG. 1, which is a structural diagram of an array substrate having one drilling process in the prior art. In FIG. 1, a structural diagram of a partial structure of a thin film transistor (TFT) using a back channel etching (BCE) structure is shown. The structure mainly includes a first metal layer 11', a gate insulating layer 12', a second metal layer 13' (forming an active layer, a source and a drain made of IGZO), a passivation layer 14' and an indium tin oxide (ITO) layer 15', which are sequentially deposited on the glass substrate 10'. It can be shown that the connection between the ITO layer 15' and the second metal layer 13', the first metal layer 11' is achieved by performing the drilling process after depositing the passivation layer to form a deep hole and a shallow hole. However, such a process may have disadvantages, because in order to cooperate with the deep hole etching, the shallow hole etching time is too long, and the via hole coking residue may occur, thus resulting in excessive via hole contact resistance and poor conduction performance, which may cause display abnormality. This situation generally occurs to in-plane small holes.

For solving the problem of residual in-plane via hole residue, in some processes, a step of trenching the gate insulating layer is added. Namely, the gate insulating layer and the passivation layer are respectively drilled, so that there is no foregoing deep hole and shallow hole situation. As shown in FIG. 2, which is a structural diagram of an array substrate having two drilling processes in the prior art, although this method can solve the problem of the in-plane via hole residue, in the splicing screen shown in FIG. 3, the upper half screen (AA-1) and the lower half screen (AA-2) are respectively connected to the bonding area 17', the upper half screen and the lower half screen will have a charge mismatch in the process, and in case that the out-of-plane regions of the upper and lower half screens both adopt gate insulating drilling process, it is easy to accumulate static electricity during the drying process. Therefore, in a screen splicing middle position of the common electrode layer 16' (COM), and there is a voltage difference of charges of the upper and lower half screens to form an electrostatic discharge (ESD), which causes the display panel to fail to display normally, and even a film is peeled off due to ESD, the subsequent process cannot be implemented.

SUMMARY OF THE INVENTION

An objective of the present invention is to provide a manufacturing method of an array substrate and an array substrate, which can improve product performances in an out-of-plane region and an in-plane region, and can improve product yield.

For solving the aforesaid issue, the embodiment of the present invention provides a manufacturing method of an array substrate, comprising steps of:

depositing a first metal layer on an in-plane region and an out-of-plane region of the substrate;

depositing a gate insulating layer on the substrate and the first metal layer, and forming a first via hole in the in-plane region of the gate insulating layer, wherein the first via hole directly reaches a surface of the first metal layer of the in-plane region;

depositing a second metal layer in the in-plane region and the out-of-plane region of the gate insulating layer, wherein the second metal layer located in the in-plane region fills the first via hole;

depositing a passivation layer on the second metal layer and the gate insulating layer, and forming a second via hole in the in-plane region of the passivation layer, which directly reaches a surface of the second metal layer of the in-plane region; forming a third via hole in the out-of plane region of the passivation layer, which directly reaches a surface of the second metal layer of the out-of plane region, and forming a fourth via hole in the out-of plane region of the passivation layer, which directly reaches a surface of the first metal layer of the out-of plane region;

depositing a transparent conductive layer in the in-plane region and in the out-of-plane region of the passivation layer, respectively, and the transparent conductive layer in the in-plane region fills the second via hole, and the transparent conductive layer in the out-of-plane region fills the third via hole and the fourth via hole.

The gate insulating layer is made of SiOx material or SiOx/SiNx laminated composite material, and the transparent conductive layer is an indium tin oxide film layer.

The first via hole is directly opposite to and located above the first metal layer of the in-plane region, and the second via hole is directly opposite to and located above the second metal layer of the in-plane region; the third via hole is directly opposite to and located above the second metal layer of the out-of-plane region, and the fourth via hole is directly opposite to and located above the first metal layer of the out-of-plane region.

The first via hole and the second via hole are offset from each other,

The second via hole, the third via hole and the fourth via hole are obtained by using a same photomask.

Correspondingly, the present invention further provides an array substrate, at least comprising:

a substrate;

a first metal layer, deposited in an in-plane region of a substrate;

a gate insulating layer, deposited on the substrate and the first metal layer;

wherein a first via hole is formed in a position on the first metal layer in the in-plane region of the gate insulating layer, and the first via hole directly reaches a surface of the first metal layer;

a second metal layer, deposited in the in-plane region and the out-of-plane region of the gate insulating layer, wherein the second metal layer located in the in-plane region fills the first via hole;

a passivation layer, deposited on the second metal layer and the gate insulating layer; wherein a second via hole is formed in a position on the second metal layer in the in-plane region of the passivation layer, and the second via hole directly reaches a surface of the second metal layer;

a transparent conductive layer, deposited in the in-plane region of the passivation layer, wherein the transparent conductive layer in the in-plane region fills the second via hole.

The first metal layer is further deposited in an out-of-plane region of the substrate;

the second metal layer is further deposited in the out-of-plane region of the gate insulating layer;

a third via hole, which directly reaches a surface of the second metal layer of the out-of-plane region, is formed in the out-of-plane region of the passivation layer, and a fourth via hole, which directly reaches a surface of the first metal layer of the out-of-plane region, is formed in the out-of-plane region of the passivation layer:

the transparent conductive layer is deposited in the out-of-plane region of the passivation layer, and the transparent conductive layer fills the third via hole and the fourth via hole.

The gate insulating layer is made of SiOx material or SiOx/SiNx laminated composite material, and the transparent conductive layer is an indium tin oxide film layer.

The first via hole and the second via hole are offset from each other.

The second via hole, the third via hole and the fourth via hole are obtained by using a same photomask.

With implementing the embodiments of the present invention, the benefits are:

the present invention provides a manufacturing method of an array substrate and an array substrate, and by forming a via hole in the gate insulating layer and a via hole in the passivation layer, respectively in the in-plane region, since there is no deep hole and shallow hole, the etching time of each via hole can be more conveniently controlled. The coking residue can be avoided when the shallow hole etching time is too long, so that the normal in-plane contact resistance can be ensured to obtain the normal display effect.

Meanwhile, the via hole in the out-of-plane region still adopts the design that the deep hole and the shallow hole are formed at the same time. Then, the out-of-plane regions of the upper half screen and the lower half screen do not require a solo drilling process of the gate insulating layer and a drying process, so it is not easy to accumulate static electricity. Therefore, a probability of occurrence of electrostatic discharge formed by the presence of a voltage difference of the upper and lower half screen charges at the splicing position of the common electrode layer can be avoided, thereby improving product yield and reducing production cost.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
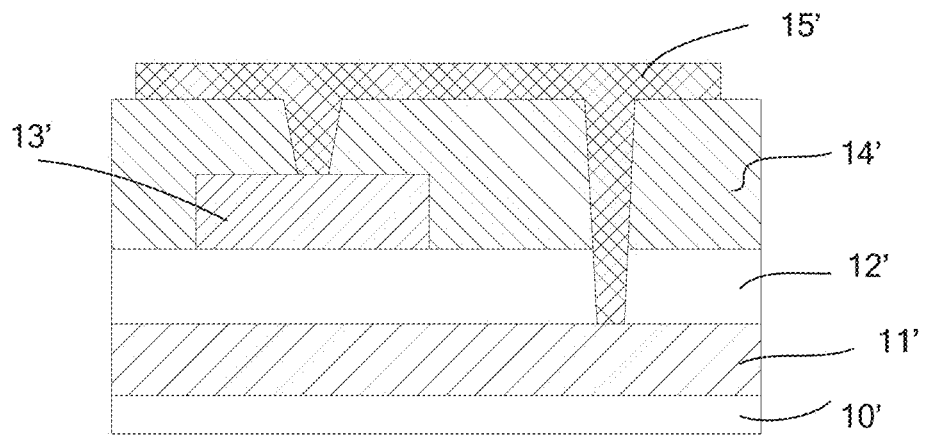
FIG. 1 is a structural diagram of an array substrate having one drilling process in the prior art.
Figure 2:
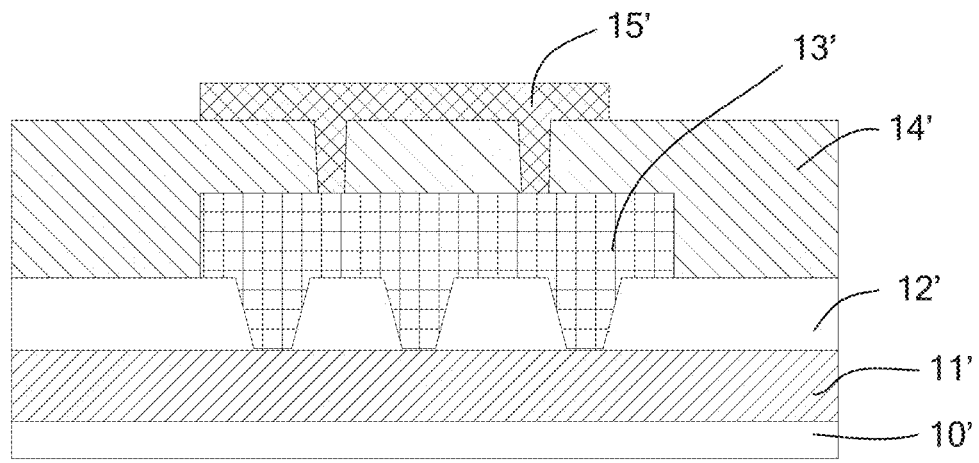
FIG. 2 is a structural diagram of an array substrate having two drilling processes in the prior art.
Figure 3:
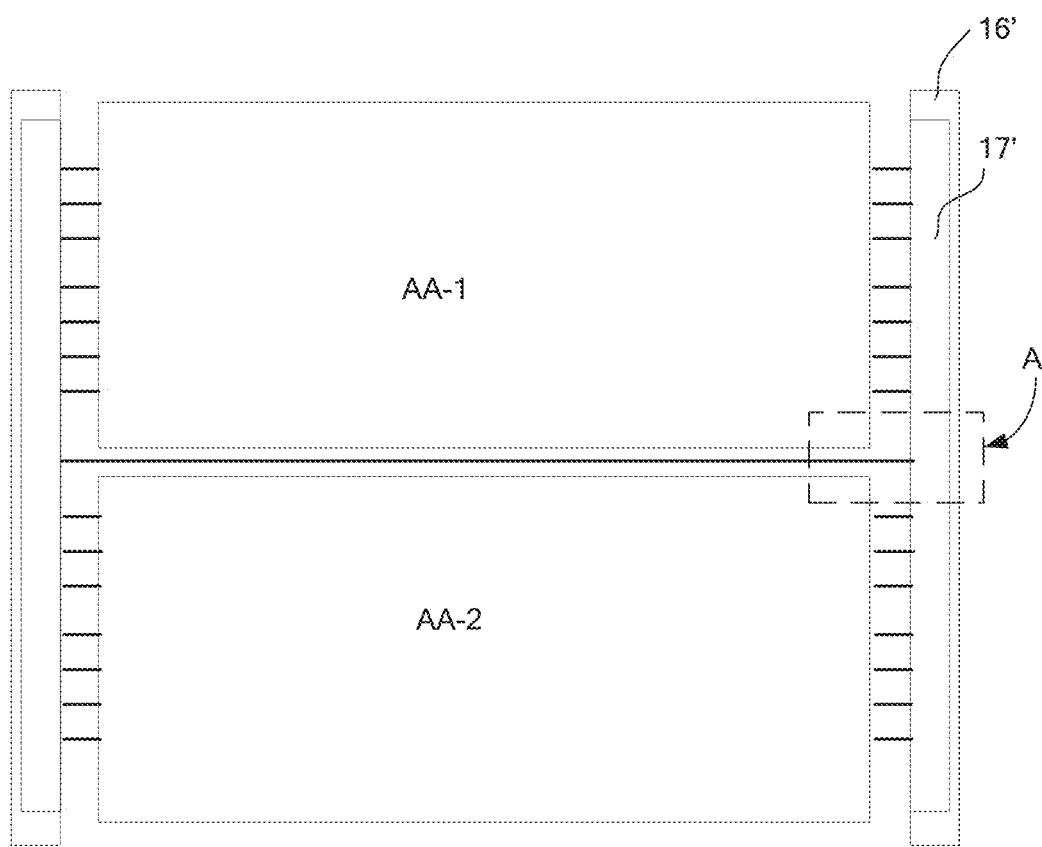
FIG. 3 is a structural diagram of a splicing screen in the prior art.

Embodiments of the present invention are described in detail with the technical matters, structural features, achieved objects, and effects with reference to the accompanying drawings as follows. It is clear that the described embodiments are merely part of embodiments of the present invention, but not all embodiments. Based on the embodiments of the present invention, all other embodiments to those of ordinary skill in the premise of no creative efforts obtained, should be considered within the scope of protection of the present invention.

Here, it should also be noted that, in order to avoid obscuring the present invention due to unnecessary details, only the structures and/or processing steps closely related to the solution according to the present invention are shown in the drawings, and other details that are not relevant to the present invention are omitted.

Figure 4:
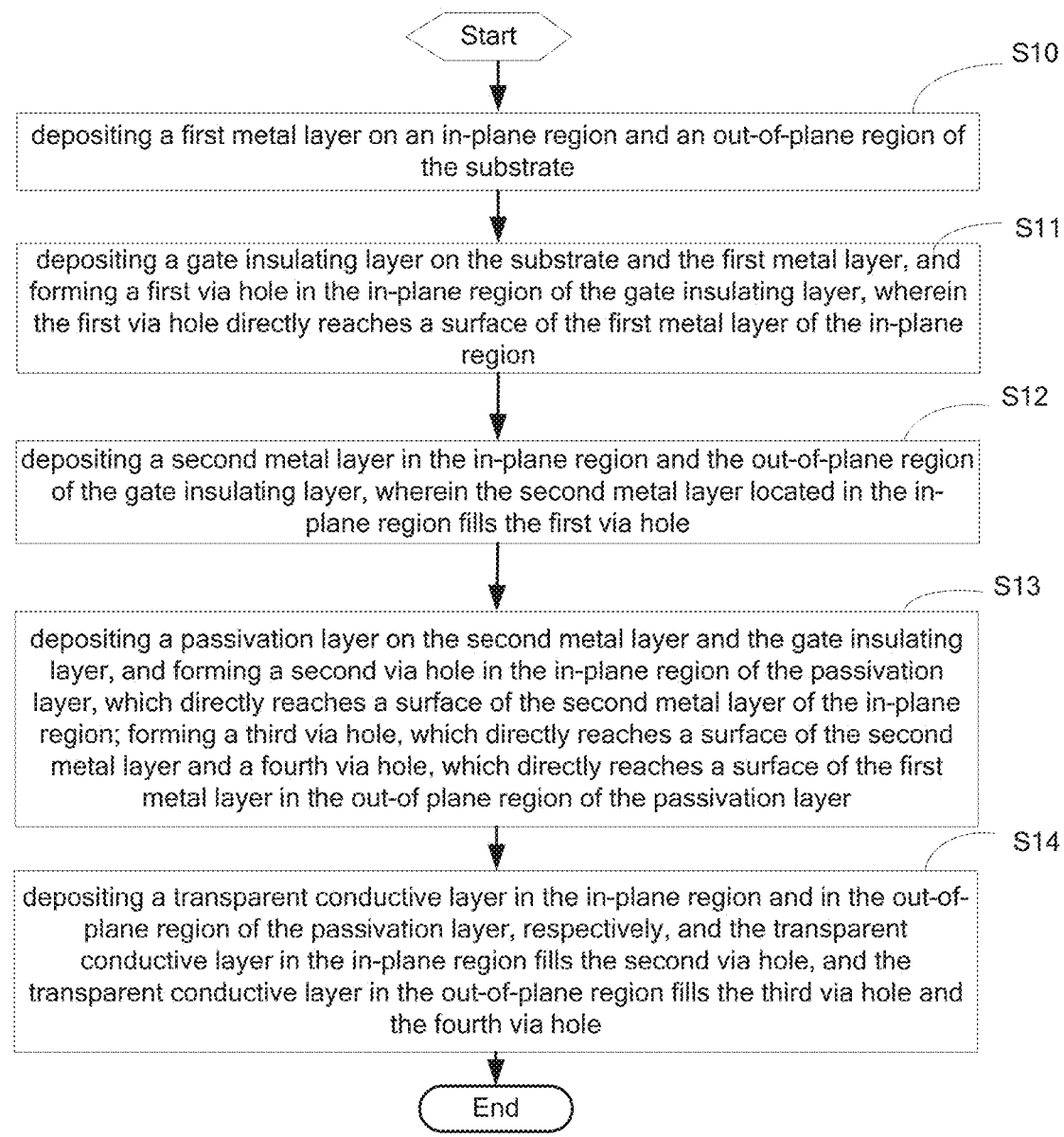
FIG. 4 is a main flowchart diagram of one embodiment of a manufacturing method of an array substrate provided by the present invention.
Figure 5:
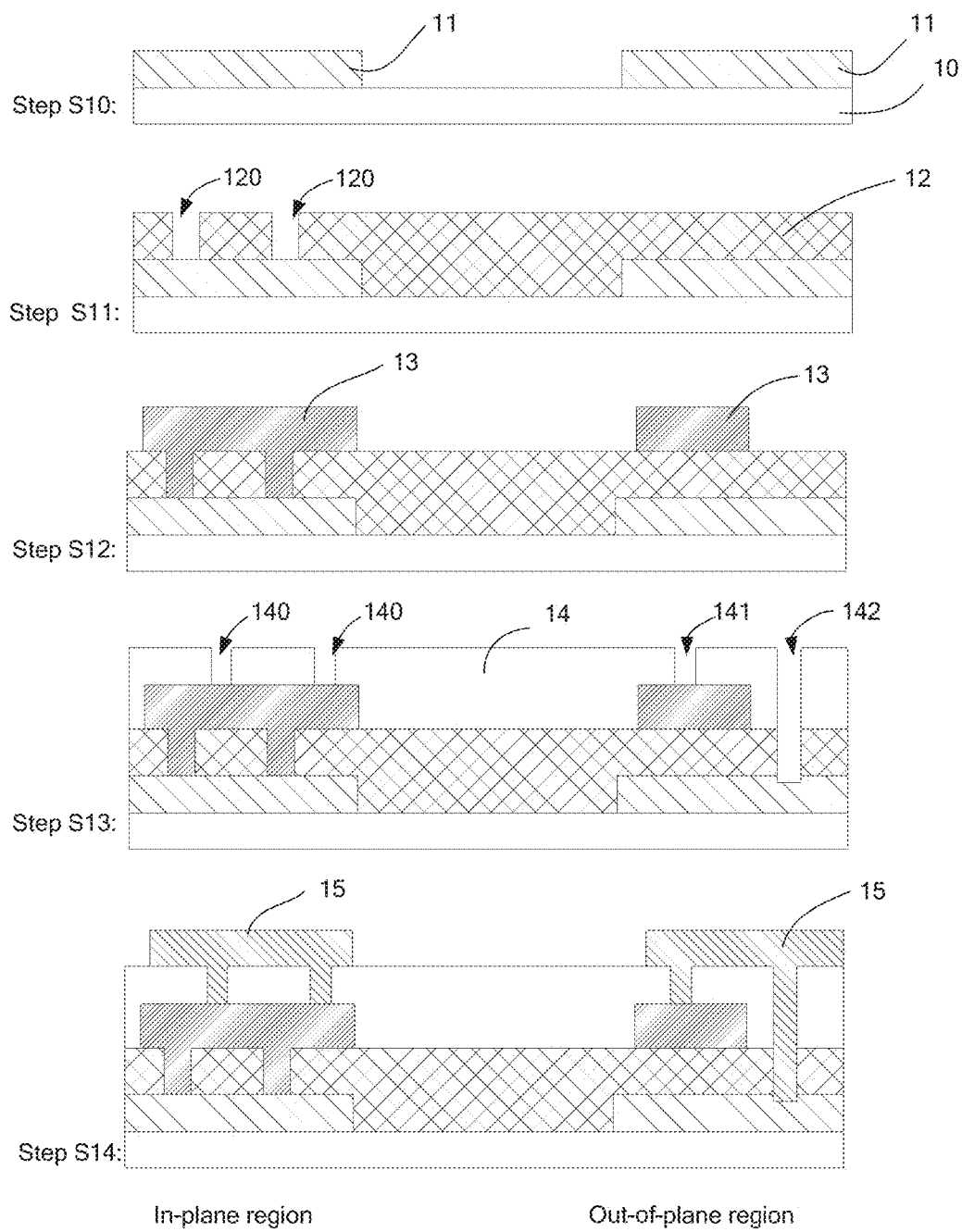
FIG. 5 is a structural diagram corresponding to respective steps of FIG. 4.

As shown in FIG. 4, a main flowchart diagram of one embodiment of a manufacturing method of an array substrate provided by the present invention is illustrated with conjunction of a structural diagram corresponding to respective steps of the manufacturing method shown in FIG. 5. In the embodiment, the manufacturing method comprises steps of:

Step S10, depositing a first metal layer 11 on an in-plane region and an out-of-plane region of the substrate 10, wherein the substrate 10 may be a glass substrate or a polyimide substrate;

Step S11, depositing a gate insulating layer 12 on the substrate 10 and the first metal layer 11, and forming a first via hole 120 in a position on the first metal layer 11 in the in-plane region of the gate insulating layer 12, wherein the first via hole 120 directly reaches a surface of the first metal layer 11; wherein the gate insulating layer 12 is made of SiOx material or SiOx/SiNx laminated composite material;

Step S12, depositing a second metal layer 13 in an in-plane region and an out-of-plane of the gate insulating layer 12, respectively wherein the second metal layer 13 located in the in-plane region fills the first via hole 120, so that the second metal layer 13 is electrically connected with the first metal layer 11; the first via hole 120 is directly opposite to and located above the first metal layer 111 of the in-plane region.

Step S13, depositing a passivation layer 14 on the second metal layer 13 and the gate insulating layer 12, and forming a second via hole 140 in a position on the second metal layer 13 in the in-plane region of the passivation layer 14, which directly reaches a surface of the second metal layer 13 of the in-plane region; forming a third via hole 141 in a position on the second metal layer 13 in the out-of plane region of the passivation layer 14, which directly reaches a surface of the second metal layer 13 of the out-of plane region, and forming a fourth via hole 142 in a position on the first metal layer 11 in the out-of plane region of the passivation layer 14, which directly reaches a surface of the first metal layer 11 of the out-of plane region; wherein the second via hole 140 and the first via hole 120 are offset from each other; and in Step S13, the second via hole 140, the third via hole 141 and the fourth via hole 142 are obtained by using a same photomask; moreover, the second via hole 140 is directly opposite to and located above the second metal layer 13 of the in-plane region; the third via hole 141 is directly opposite to and located above the second metal layer 13 of the out-of-plane region, and the fourth via hole 142 is directly opposite to and located above the first metal layer 11 of the out-of-plane region.

Step S14, depositing a transparent conductive layer 15 in the in-plane region and in the out-of-plane region of the passivation layer 14, respectively, and the transparent conductive layer 15 in the in-plane region fills the second via hole 140, so that the transparent conductive layer 15 is electrically connected with the second metal layer 13; the transparent conductive layer 15 in the out-of-plane region fills the third via hole 141 and the fourth via hole 142, so that the transparent conductive layer 15 is electrically connected with the second metal layer 13 and the first metal layer 11. In one embodiment, the transparent conductive layer 15 may specifically be an indium tin oxide (ITO) film layer.

Specifically, in the present invention, the "in-plane region" refers to a display area of the liquid crystal panel, and the "out-of-plane region" refers to a non-display area of a liquid crystal panel provided around the display area.

Correspondingly, the embodiment of the present invention further provides an array substrate, applied in a splicing screen, comprising:

a substrate 10;

a first metal layer 11, deposited on an in-plane region and an out-of-plane region of the substrate 10, respectively;

a gate insulating layer 12, deposited on the substrate 10 and the first metal layer 11;

wherein a first via hole 120 is formed in a position on the first metal layer 11 in the in-plane region of the gate insulating layer 12, and the first via hole 120 directly reaches a surface of the first metal layer 11; wherein the gate insulating layer 12 is made of SiOx material or SiOx/SiNx laminated composite material;

a second metal layer 13, deposited in the in-plane region and the out-of-plane region of the gate insulating layer 12, respectively, wherein the second metal layer 13 located in the in-plane region fills the first via hole 120;

a passivation layer 14, deposited on the second metal layer 13 and the gate insulating layer 12; wherein a second via hole 140, which directly reaches a surface of the second metal layer 13, is formed in a position on the second metal layer 13 in the in-plane region of the passivation layer 14, and the second via hole 140 and the first via hole 120 are offset from each other; a third via hole 141, which directly reaches a surface of the second metal layer 13, is formed in a position on the second metal layer 13 in the out-of-plane region of the passivation layer 14, and a fourth via hole 142, which directly reaches a surface of the first metal layer 11, is formed in a position on the first metal layer 11 in the out-of-plane region of the passivation layer 14; in one embodiment, the second via hole 140, the third via hole 141 and the fourth via hole 142 are obtained by using a same photomask;

an indium tin oxide (ITO) film layer 15, deposited in the in-plane region and the out-of-plane region of the passivation layer 14, respectively, wherein the ITO film layer 15 in the in-plane region fills the second via hole 140; the ITO film layer 15 in the out-of-plane region fills the third via hole 141 and the fourth via hole 142.

It can be understood that in the array substrate provided by the present invention, since the via hole in the out-of-plane region still adopts the design that the deep hole and the shallow hole are formed at the same time, the out-of-plane regions of the upper half screen and the lower half screen do not require a solo drilling of the gate insulating layer and a drying process, so it is not easy to accumulate static electricity. As being applied in a splicing screen of the upper half screen and the lower half screen, the probability of occurrence of electrostatic discharge formed by the presence of the voltage difference of the upper and lower half screen charges at the splicing position of the common electrode layer can be avoided, thereby improving product yield of the splicing screen.

For more details, please refer to the foregoing description of FIG. 4 and FIG. 5, which will not be described in detail herein.

With implementing the embodiments of the present invention, the benefits are:

the present invention provides a manufacturing method of an array substrate and an array substrate, and by forming a via hole in the gate insulating layer and a via hole in the passivation layer, respectively in the in-plane region, since there is no deep hole and shallow hole, the etching time of each via hole can be more conveniently controlled. The coking residue can be avoided when the shallow hole etching time is too long, so that the normal in-plane contact resistance can be ensured to obtain the normal display effect.

Meanwhile, the via hole in the out-of-plane region still adopts the design that the deep hole and the shallow hole are formed at the same time. Then, the out-of-plane regions of the upper half screen and the lower half screen do not require a solo drilling process of the gate insulating layer and a drying process, so it is not easy to accumulate static electricity. Therefore, a probability of occurrence of electrostatic discharge formed by the presence of a voltage difference of the upper and lower half screen charges at the splicing position of the common electrode layer can be avoided, thereby improving product yield and reducing production cost.

Incidentally, herein, relational terms such as first and second and the like are only used to distinguish one entity or operation from another entity or operation separate, without necessarily requiring or implying these entities or operations of between the presence of any such actual relationship or order. Further, the term "comprising", "containing" or any other variation thereof are intended to cover a non-exclusive inclusion, such that a process, method, article, article, or apparatus not include only those elements but not expressly listed further comprising the other elements, or further comprising such process, method, article, or apparatus inherent elements. Without more constraints, by the wording "include a" defined does not exclude the existence of additional identical elements in the element comprising a process, method, article, or apparatus.

Above are only specific embodiments of the present application, the scope of the present application is not limited to this, and to any persons who are skilled in the art, change or replacement which is easily derived should be covered by the protected scope of the application. Thus, the protected scope of the application should go by the subject claims.

What is claimed is:

1. A manufacturing method of an array substrate, comprising steps of:
   depositing a first metal layer on an in-plane region and an out-of-plane region of the substrate;
   depositing a gate insulating layer on the substrate and the first metal layer, and forming a first via hole in the in-plane region of the gate insulating layer, wherein the first via hole directly reaches a surface of the first metal layer of the in-plane region;
   depositing a second metal layer in the in-plane region and the out-of-plane region of the gate insulating layer, wherein the second metal layer located in the in-plane region fills the first via hole;
   depositing a passivation layer on the second metal layer and the gate insulating layer, and forming a second via hole in the in-plane region of the passivation layer, which directly reaches a surface of the second metal layer of the in-plane region; forming a third via hole in the out-of plane region of the passivation layer, which directly reaches a surface of the second metal layer of the out-of plane region, and forming a fourth via hole in the out-of plane region of the passivation layer, which directly reaches a surface of the first metal layer of the out-of plane region;
   depositing a transparent conductive layer in the in-plane region and in the out-of-plane region of the passivation layer, respectively, and the transparent conductive layer in the in-plane region fills the second via hole, and the transparent conductive layer in the out-of-plane region fills the third via hole and the fourth via hole.

2. The manufacturing method of the array substrate according to claim 1, wherein the gate insulating layer is made of SiOx material or SiOx/SiNx laminated composite material, and the transparent conductive layer is an indium tin oxide film layer.

3. The manufacturing method of the array substrate according to claim 1, wherein the first via hole is directly opposite to and located above the first metal layer of the in-plane region, and the second via hole is directly opposite to and located above the second metal layer of the in-plane region; the third via hole is directly opposite to and located above the second metal layer of the out-of-plane region, and the fourth via hole is directly opposite to and located above the first metal layer of the out-of-plane region.

4. The manufacturing method of the array substrate according to claim 3, wherein the first via hole and the second via hole are offset from each other.

5. The manufacturing method of the array substrate according to claim 4, wherein the second via hole, the third via hole and the fourth via hole are obtained by using a same photomask.

6. An array substrate, at least comprising:
   a substrate;
   a first metal layer, deposited in an in-plane region of a substrate;
   a gate insulating layer, deposited on the substrate and the first metal layer;
   wherein a first via hole is formed in a position on the first metal layer in the in-plane region of the gate insulating layer, and the first via hole directly reaches a surface of the first metal layer;
   a second metal layer, deposited in the in-plane region and the out-of-plane region of the gate insulating layer, wherein the second metal layer located in the in-plane region fills the first via hole;
   a passivation layer, deposited on the second metal layer and the gate insulating layer; wherein a second via hole is formed in a position on the second metal layer in the in-plane region of the passivation layer, and the second via hole directly reaches a surface of the second metal layer;
   a transparent conductive layer, deposited in the in-plane region of the passivation layer, wherein the transparent conductive layer in the in-plane region fills the second via hole.

7. The array substrate according to claim 6, wherein
   the first metal layer is further deposited in an out-of-plane region of the substrate;
   the second metal layer is further deposited in the out-of-plane region of the gate insulating layer;
   a third via hole, which directly reaches a surface of the second metal layer of the out-of-plane region, is formed in the out-of-plane region of the passivation layer, and a fourth via hole, which directly reaches a surface of the first metal layer of the out-of-plane region, is formed in the out-of-plane region of the passivation layer;
   the transparent conductive layer is deposited in the out-of-plane region of the passivation layer, and the transparent conductive layer fills the third via hole and the fourth via hole.

8. The array substrate according to claim 7, wherein the gate insulating layer is made of SiOx material or SiOx/SiNx laminated composite material, and the transparent conductive layer is an indium tin oxide film layer.

9. The array substrate according to claim 8, wherein the first via hole and the second via hole are offset from each other.

10. The array substrate according to claim 9, wherein the second via hole, the third via hole and the fourth via hole are obtained by using a same photomask.

* * * * *